US009537286B2

(12) United States Patent
Letsch et al.

(10) Patent No.: US 9,537,286 B2
(45) Date of Patent: Jan. 3, 2017

(54) CIRCUIT SYSTEM AND MANUFACTURING METHOD FOR SAME

(71) Applicant: Robert Bosch GmbH, Stuttgart (DE)

(72) Inventors: Andreas Letsch, Stuttgart (DE); Hans-Jochen Schwarz, Stuttgart (DE); Martin Astner, Freiberg A.N. (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/404,706

(22) PCT Filed: Apr. 11, 2013

(86) PCT No.: PCT/EP2013/057545
§ 371 (c)(1),
(2) Date: Dec. 1, 2014

(87) PCT Pub. No.: WO2013/178397
PCT Pub. Date: Dec. 5, 2013

(65) Prior Publication Data
US 2015/0110140 A1    Apr. 23, 2015

(30) Foreign Application Priority Data

Jun. 1, 2012   (DE) .................. 10 2012 209 266

(51) Int. Cl.
*H01S 3/00*         (2006.01)
*H01S 5/00*         (2006.01)
(Continued)

(52) U.S. Cl.
CPC ............ *H01S 5/026* (2013.01); *H01S 5/4018* (2013.01); *H01S 5/423* (2013.01);
(Continued)

(58) Field of Classification Search
CPC ........ H01S 5/026; H01S 5/423; H01S 5/4018; H01S 5/02276; H01S 5/0224; H01S 5/4031; H01L 2224/4847; H01L 2224/49175
See application file for complete search history.

(56) References Cited

U.S. PATENT DOCUMENTS

| 5,930,279 A | 7/1999 | Apollonov et al. |
| 6,194,743 B1 * | 2/2001 | Kondoh ............... H01L 33/40 |
| | | 257/745 |

(Continued)

FOREIGN PATENT DOCUMENTS

| JP | S58 95889 | 6/1983 |
| WO | WO 95/07565 | 3/1995 |

OTHER PUBLICATIONS

International Search Report for PCT/EP2013/057545, dated Nov. 11, 2013.

*Primary Examiner* — Yuanda Zhang
(74) *Attorney, Agent, or Firm* — Norton Rose Fulbright US LLP; Gerard Messina

(57) ABSTRACT

A circuit system includes: a first optoelectronic semiconductor component situated with an n-conductive surface facing an electrically conductive support surface and connected to the support surface in an electrically conductive manner; and a second optoelectronic semiconductor component situated with a p-conductive surface facing the support surface and connected to the support surface in an electrically conductive manner.

17 Claims, 10 Drawing Sheets

(51) Int. Cl.
*H01S 5/026* (2006.01)
*H01S 5/40* (2006.01)
*H01S 5/42* (2006.01)
*H01S 5/022* (2006.01)

(52) U.S. Cl.
CPC ............... *H01L 2224/4847* (2013.01); *H01L 2224/49175* (2013.01); *H01S 5/0224* (2013.01); *H01S 5/02276* (2013.01); *H01S 5/4031* (2013.01)

(56) References Cited

U.S. PATENT DOCUMENTS

| | | | |
|---|---|---|---|
| 2001/0055325 A1* | 12/2001 | Nemoto | H01S 5/4031 372/50.1 |
| 2011/0069731 A1 | 3/2011 | Gokay | |
| 2012/0250715 A1* | 10/2012 | Muller et al. | 372/45.01 |
| 2013/0264591 A1* | 10/2013 | Hussell | H01L 33/36 257/88 |

* cited by examiner

CIRCUIT SYSTEM AND MANUFACTURING METHOD FOR SAME

BACKGROUND OF THE INVENTION

1. Field of the Invention

The present invention relates to a circuit system which includes at least two optoelectronic semiconductor components, and to a method for manufacturing this type of circuit system.

2. Description of the Related Art

FIG. 1 shows an example of a known circuit system 2000 which includes a series circuit made up of two optoelectronic semiconductor components 2002, 2004 which are VCSEL arrays, for example, i.e., systems which each include a plurality of surface-emitting semiconductor lasers (vertical cavity surface-emitting lasers (VCSELs)).

The known VCSEL arrays have a layer structure made of an n-conductive semiconductor material, a p-conductive semiconductor material, and an active zone situated in between for generating laser radiation. In addition, on a first side both VCSEL arrays 2002, 2004 have a connecting area 2002', 2004', respectively, at which they may be electrically contacted with the aid of bonding wires. The known series circuit is implemented in that first VCSEL array 2002, with its second side opposite from its first side, is situated on an electrically conductive support surface, not shown in greater detail in FIG. 1, and is connected to same in an electrically conductive manner. Similarly, second VCSEL array 2004 with its second side is situated on a further support surface (likewise not shown) associated with the second VCSEL array, and is electrically connected to same. The series circuit of VCSEL arrays 2002, 2004 is implemented with the aid of bonding wires BD2 which electrically connect the support surface of first VCSEL array 2002, in a manner known per se, to a contacting or connecting area 2004' of second VCSEL array 2004.

An electrical power supply of the series circuit made up of VCSEL arrays 2002, 2004 is provided via power supply connections V1, V2. An electrical connection between connections V1, V2 and the known series circuit is implemented with the aid of additional bonding wires BD1, BD3, respectively.

One disadvantage of the known configuration is a relatively large intercomponent distance d24 due to the presence of connecting area 2004', the electrical insulation of the support surfaces of VCSEL arrays 2002, 2004 with respect to one another, and the mounting surface of bonding wires BD2 on the lower area of the support surface of first VCSEL array 2002 in FIG. 1. Therefore, the known circuit emits no laser radiation within the area defined by intercomponent distance d24. Thus, the brilliance of known circuit system 2000 is disadvantageously relatively low, since the space having dimension d24 in the vertical direction in FIG. 1 is not able to contribute to the generation of laser radiation.

Another disadvantage of known configuration 2000 is the relatively large component size. In addition, the connection which is necessary for electrically contacting VCSEL arrays 2002, 2004 with the aid of bonding wires is costly and time-consuming.

BRIEF SUMMARY OF THE INVENTION

Accordingly, the object of the present invention is to improve a circuit system of the type mentioned at the outset in such a way that the above-mentioned disadvantages of the related art are avoided.

For a circuit system of the type mentioned at the outset, this object is achieved according to the present invention in that a first optoelectronic semiconductor component is situated with an n-conductive surface facing an electrically conductive support surface and is connected to the support surface in an electrically conductive manner, and that a second optoelectronic semiconductor component is situated with a p-conductive surface facing the support surface and is connected to the support surface in an electrically conductive manner.

The principle according to the present invention, which provides for a different mounting of the two semiconductor components on their shared electrically conductive support surface, has the advantage that an electrical connection, a series circuit, for example, of the two semiconductor components is already implementable due to the electrical connection of the semiconductor components to the shared support surface. Bonding wires BD2 (FIG. 1) which are necessary in conventional systems may thus be advantageously dispensed with, which significantly reduces the level of assembly effort and the associated costs. In addition, the semiconductor components provided according to the present invention may be mounted on their shared support surface at a smaller distance from one another, so that, in particular in the case of VCSEL arrays, the brilliance, for example, of the resulting circuit system may also be increased, since the surface area which does not contribute to the emission of laser radiation is significantly smaller than the corresponding surface area in the known system (see intercomponent distance d24 in FIG. 1).

In one advantageous specific embodiment, it is provided that the at least two optoelectronic semiconductor components each include a plurality of surface-emitting semiconductor lasers (vertical cavity surface-emitting lasers (VCSELs)) and/or edge-emitting semiconductor lasers.

Other optoelectronic components such as light-emitting diodes (LED), photodiodes, and the like may likewise be advantageously integrated into at least one or also both of the semiconductor components provided according to the present invention.

In providing one or multiple surface-emitting lasers in one or both semiconductor components, the configuration of the semiconductor lasers is to be selected in such a way that a surface area used for the emission of laser radiation is situated in each case on that surface of the semiconductor component which is situated opposite from the mounting surface for electrically contacting the shared support surface. For example, light exit surfaces for surface-emitting semiconductor lasers of a first semiconductor component are therefore to be arranged in such a way that they are situated in the p-conductive surface or layer, while the n-conductive surface or layer is used for electrically contacting the support surface. Similarly, for a second optoelectronic semiconductor component which with its p-conductive surface or layer is situated on the support surface, it is to be provided that light exit apertures contained in the second optoelectronic semiconductor component are situated in the n-conductive surface or layer opposite from the p-conductive surface. The geometric size of the optoelectronic semiconductor components, which are used for forming the circuit system according to the present invention, in particular their surface area, is essentially arbitrarily selectable, and depends, among other things, on the technology or the desired target configuration used for manufacturing the semiconductor components.

For example, the semiconductor components may be directly removed from a corresponding wafer (with the aid of known methods), and, according to the present invention, subsequently arranged on a shared electrically conductive support surface and electrically contacted with same. According to one specific embodiment, the contacting may take place with the aid of integral joining, for example soldering, or alternatively or additionally, by clamping or the like.

The number and/or density or other spatial arrangement of optoelectronic elements (VCSELs, LEDs, photodiodes, etc.) in the semiconductor components or the wafers which form the starting material for same may be selected essentially arbitrarily.

In another advantageous specific embodiment, it is provided that at least one optoelectronic semiconductor component, preferably both semiconductor components, has/have, for example, an essentially rectangular basic shape having two long sides and two short sides in each case, i.e., a shape which differs from a square. In addition, a connecting area for electrically contacting a surface is advantageously situated essentially along at least one of the two short sides. The electrical contacting in the connecting area may once again take place with the aid of bonding wires. The arrangement according to the present invention of the connecting area along at least one of the two short sides of the rectangular semiconductor component advantageously results in the option for connecting additional semiconductor components to the sides of the semiconductor component which are not used for contacting, i.e., which do not have the connecting area, so that very high brilliance of the overall device is achievable, in particular in the case of light-emitting semiconductor components, since the intercomponent distances at the non-connecting areas may be significantly decreased compared to conventional systems.

In another advantageous specific embodiment, it is provided that both optoelectronic semiconductor components are arranged on the support surface in such a way that their connecting areas are each associated with the same side of the support surface. This results in a configuration for the circuit system in which only one side of the electrical support surface of the circuit system has connecting areas for the semiconductor components in question. In this way, the remaining sides of the support surface may in turn be situated relatively close to additional adjacent circuit systems, which in particular are identical, without, for example, the emission of laser radiation from the semiconductor components in question being impaired by bonding wires and the like situated in these areas.

In another advantageous specific embodiment, it is provided that both optoelectronic semiconductor components are arranged on the support surface in such a way that their connecting areas are each associated with respective opposite sides of the support surface. In this specific embodiment, the resulting configuration accordingly has two connecting areas on respective opposite sides of the electrically conductive support surface, in every case two sides of the essentially rectangular geometry not being used for the electrical contacting, and thus remaining free for the arrangement of adjacent circuit systems. At the same time, an essentially rectangular geometry for the resulting circuit system may be achieved by this configuration. This configuration is also particularly advantageous for the arrangement of edge-emitting semiconductor lasers in the semiconductor components, since the two semiconductor components, which according to the present invention are arranged on the support surface, may be situated very close to one another, so that the distance between edge emitters of the first semiconductor component and of the second semiconductor component is relatively small, as the result of which a virtually seamless arrangement of the edge emitters side by side across both semiconductor components is possible.

In another advantageous specific embodiment, it is provided that both optoelectronic semiconductor components each have an essentially trapezoidal or triangular basic shape, as the result of which polygonal overall geometries of the circuit system, or of configurations made up of multiple circuit systems according to the present invention, may advantageously be achieved.

In another specific embodiment, in the case of a trapezoidal basic shape the longer base side of the trapezoidal geometry is provided in a particularly advantageous manner with a connecting area for the electrical contacting, so that a particularly large cross section of electrically conductive areas is available for supplying electrical power to the semiconductor component.

In another variant of the present invention, it is provided that in the case of a trapezoidal basic shape, the optoelectronic semiconductor components are arranged with respect to one another in such a way that their shorter base sides are situated opposite one another. An essentially dumbbell-shaped configuration for the circuit system according to the present invention may thus be achieved which may be used, for example, in a radial arrangement of multiple circuit systems relative to one another in order to likewise fill a radially inner area with the areas of the trapezoidal semiconductor components in question in the area of their shorter base sides, while the additional circuit systems do not protrude into the radially inner area of the overall configuration.

According to another specific embodiment, the semiconductor components to be situated together according to the present invention on a shared support surface may also have other geometries, such as the shape of a circle and/or of a circular ring. A circuit may thus be achieved which in the radially outwardly facing direction includes a series circuit of two VCSEL arrays in each case, having the shape of a circle or of a circular ring, situated together on a support surface.

As a further approach to achieving the object of the present invention, an optoelectronic semiconductor circuit which includes at least two circuit systems according to the present invention is provided, the at least two circuit systems being electrically connected to one another in series. According to one specific embodiment, this may be achieved, for example, with the aid of electrically conductive surfaces which are comparable to the electrical support surface of the circuit system according to the present invention, and which, for example, may likewise be made of a metal plating on a substrate which is nonconductive per se. Furthermore, additional or alternative bonding wires for forming the electrical series circuit of the multiple circuit system may be used among one another. Alternatively or additionally, a parallel connection of at least two circuit systems according to the present invention is possible, as well as combinations of same.

In another specific embodiment of the semiconductor circuit, it is provided that the individual circuit systems are formed and situated relative to one another in such a way that a contour of the semiconductor circuit essentially has the shape of a preferably regular n-polygon where $n \geq 4$, or has an approximately circular shape. For example, an essentially trapezoidal or triangular circuit system may be implemented by arranging two semiconductor components, having an essentially trapezoidal or triangular shape, on a shared electrical support surface which likewise has a trapezoidal shape. A plurality of these essentially trapezoidal circuit systems may be situated with respect to one another in such a way that the above-described essentially polygonal or circular geometry results for the optoelectronic semiconductor circuit.

In this configuration, providing an electrical connecting area in the area of the longer base sides of the trapezoidal geometry of the semiconductor components is particularly advantageous, since the inner area of the resulting geometry may be kept completely clear of bonding wires or other means for electrical contacting, apart from the support surface situated at least partially beneath the semiconductor components. Bonding wires and the like are preferably rather mounted radially externally of the multiple circuit systems, and therefore do not impair the brilliance of the overall device.

The method according to the present invention provides that a first optoelectronic semiconductor component is situated with an n-conductive surface facing an electrically conductive support surface and is connected to the support surface in an electrically conductive manner, and that a second optoelectronic semiconductor component is situated with a p-conductive surface facing the support surface and is connected to the support surface in an electrically conductive manner. The electrically conductive connection between the semiconductor components and the electrically conductive support surface may be established in a manner known per se, for example with the aid of soldering, clamping, or other joining techniques familiar to those skilled in the art.

In another specific embodiment of the present invention, it is provided that at least two circuit systems are produced, in particular according to the method according to the present invention, and that these at least two circuit systems are electrically connected to one another in series, in particular with the aid of electrically conductive surfaces which are preferably situated in the same plane as the support surfaces, and/or with the aid of bonding wires. The circuit system or multiple circuit systems according to the present invention for implementing an optoelectronic semiconductor circuit may advantageously be situated on an electrically nonconductive substrate.

The principle according to the present invention, of arranging a circuit system on a shared electrical support surface using two semiconductor components, each having a different mounting ("n-up," i.e., an n-conductive layer facing the support surface, or "p-up," i.e., a p-conductive layer facing the support surface), has the significant advantage that approximately one-half of the bonding wires required in conventional devices may be dispensed with, thus significantly reducing the level of manufacturing effort and the corresponding costs.

The principle according to the present invention may advantageously be applied for implementing series circuits and/or parallel circuits of semiconductor components.

BRIEF DESCRIPTION OF THE DRAWINGS

FIG. 2b schematically shows a partial cross section of the specific embodiment according to FIG. 2a.

FIG. 9b schematically shows a cross section of the system according to FIG. 9a.

DETAILED DESCRIPTION OF THE INVENTION

Figure 1:
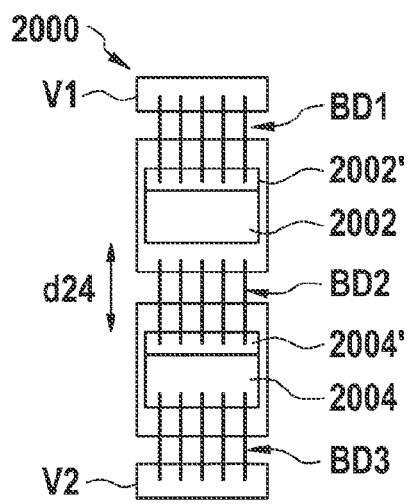
FIG. 1 schematically shows a top view of a known circuit system which includes two optoelectronic semiconductor components.

Known circuit system 2000 depicted in FIG. 1 has already been described above. It has the major disadvantage of a large intercomponent distance d24, as well as the further disadvantage that a relatively large number of bonding wires BD2 is necessary for electrically contacting semiconductor components 2002, 2004 to one another.

Figure 2A:
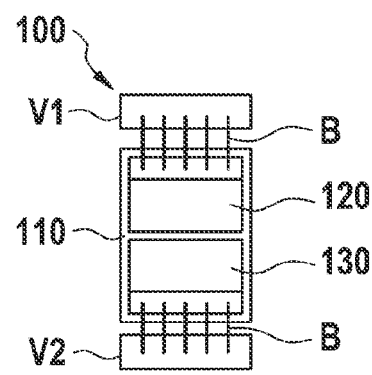
FIG. 2a schematically shows a top view of a circuit system according to the present invention according to a first specific embodiment.

FIG. 2a shows a first specific embodiment of a circuit system 100 according to the present invention. Circuit system 100 includes an electrically conductive support surface 110 which may be designed, for example, in the form of a metal plating on an electrically nonconductive substrate, not depicted in FIG. 2a. According to the present invention, circuit system 100 also includes a first optoelectronic semiconductor component 120 and a second optoelectronic semiconductor component 130, first optoelectronic semiconductor component 120 being situated with an n-conductive surface facing electrically conductive support surface 110, and being connected to support surface 110 in an electrically conductive manner. In addition, second optoelectronic semiconductor component 130 is situated with a p-conductive surface facing support surface 110, and is connected to the support surface in an electrically conductive manner. This advantageously implicitly results in an electrical connection which is usable, for example, as a series circuit of semiconductor components 120, 130 without having to provide bonding wires for this purpose, as is necessary in the known system according to FIG. 1 (see reference character BD2).

Electrical contacting of circuit system 100 according to the present invention with an operating voltage takes place by providing bonding wires B, which form a connecting area of first semiconductor component 120 in an electrically conductive manner, with a first reference potential V1 or a correspondingly designed electrically conductive surface. Contacting of second semiconductor component 130 with a second reference potential V2 is likewise achieved via bonding wires B. A series circuit of components V1, B, 120, 110, 130, B, V2 is thus formed, advantageously without the use of bonding wires for electrically connecting components 120, 130 to one another.

In contrast to the known configuration according to FIG. 1, circuit system 100 according to the present invention according to FIG. 2a thus has the major advantage that both semiconductor components 120, 130 may be mounted with a virtually negligible vertical distance d24 with respect to one another (FIG. 1). This distance need only be selected to be large enough that a reliable electrical separation between the two components 120, 130 is achieved, for which purpose several nm or several μm are sufficient. The base area necessary for circuit system 100 is thus reduced, and in addition, bonding wires BD2 for electrically connecting components 120, 130 to another may advantageously be dispensed with, since the appropriate electrical connection is established by shared support surface 110 according to the present invention.

In particular for distances d24 in the nm range, according to one preferred specific embodiment at least one side area of components 120, 130 may be provided with an insulating layer (not shown), for example a nitride coating, so that it is possible to place components 120, 130 particularly close to one another, and at the same time to reliably electrically separate their mutually facing side areas.

Figure 2B:
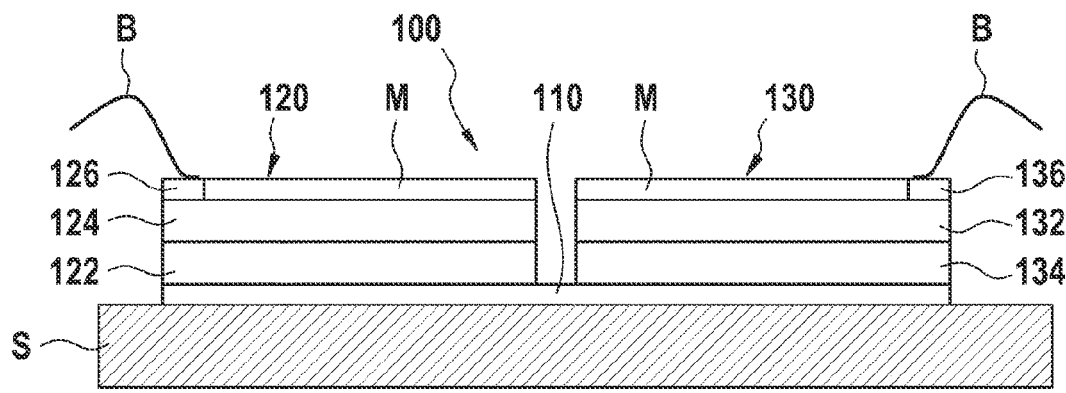
Figure 3:
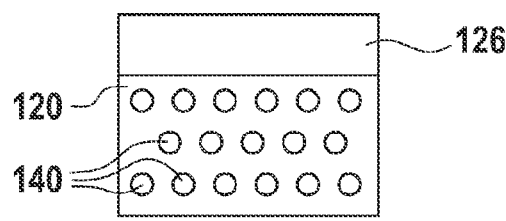
FIG. 3 schematically shows a top view of an optoelectronic semiconductor component according to one specific embodiment.

FIG. 2b shows a partial cross section of the configuration according to FIG. 2a. An electrically nonconductive substrate S is depicted at the bottom of FIG. 2b, to which electrically conductive support surface 110, in the form of a metal plating, for example, is applied. Semiconductor components 120, 130 are arranged on support surface 110, first semiconductor component 120 being situated with its n-conductive surface 122 facing support surface 110 and being connected to the support surface in an electrically conductive manner. A p-conductive surface 124 of first semiconductor component 120 is situated above the n-conductive surface or layer in FIG. 2b. A metal plating M is applied to p-conductive layer or surface 124, and in its left area in FIG. 2b forms a connecting area 126 for electrically contacting semiconductor component 120 to external systems, once again with the aid of bonding wires B, for example. In the case that semiconductor component 120 is designed as a so-called VCSEL array, i.e., a semiconductor substrate which contains a plurality of vertically emitting semiconductor lasers, metal plating M has corresponding exit apertures (as shown in FIG. 3) for emitting the laser radiation upwardly in FIG. 2b. Only the edge area of metal plating M which functions as a connecting area 126 may be implemented over the entire surface as a metal plating, i.e., without a corresponding radiation exit aperture, in order to allow a secure connection to bonding wires B.

Second semiconductor component 130 has a layer structure which is similar to the structure of first semiconductor component 120, except that its p-conductive surface 134 is situated facing support surface 110 and is connected to same in an electrically conductive manner. Accordingly, an n-conductive layer 132 is arranged above p-conductive area or layer 134 in FIG. 2b, on which once again a metal plating M is applied which in its right area in FIG. 2b once again forms a connecting area 136 for contacting with the aid of bonding wires B.

Due to the inverse arrangement of p- or n-conductive layers of the two semiconductor components 120, 130 relative to support surface 110 ("n-up" or "p-up"), an electrical series circuit advantageously results, using support surface 110, so that fairly complicated electrical joining techniques such as bonding wires BD2 (FIG. 1) may be dispensed with.

FIG. 3 shows a top view of a first semiconductor component 120 according to the embodiment in which the semiconductor component 120 is designed as the VCSEL array. Semiconductor component 120 has above-described connecting area 126 for the electrical contacting, for example with the aid of bonding wires or the like. In addition, a plurality of surface-emitting semiconductor lasers (VCSELs) 140 is provided in an area of first semiconductor component 120 which is not used for the electrical connection. It is pointed out that FIG. 3 represents only a rough schematic illustration, and that surface-emitting semiconductor lasers 140 may be much smaller in actual systems, so that a significantly greater number of surface-emitting semiconductor lasers may be arranged per unit surface area of first semiconductor component 120. Surface-emitting semiconductor lasers may typically have exit apertures with a maximum opening width of several μm to several 10 μm.

Figure 15:
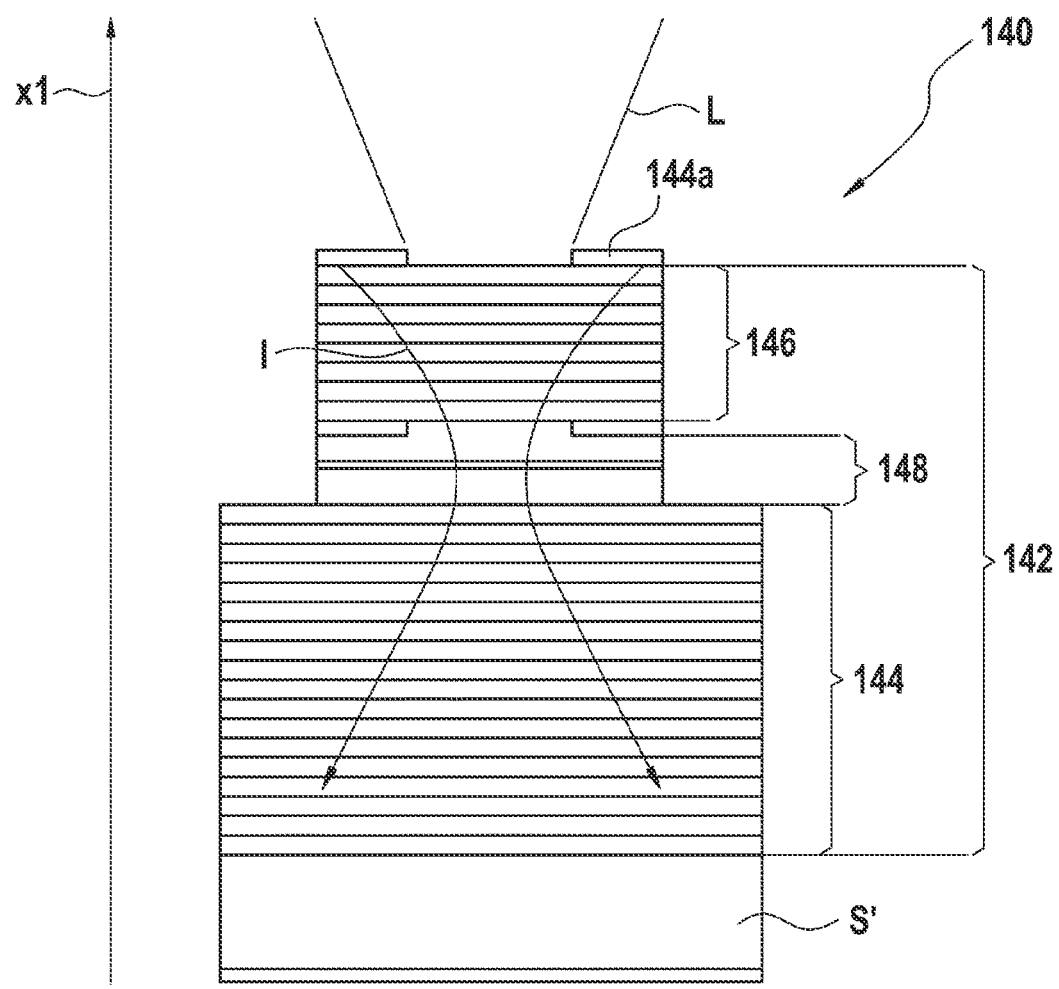
FIG. 15 schematically shows a side view of a surface-emitting semiconductor laser.

FIG. 15 shows an example of a side view and a partial cross section of a surface-emitting semiconductor laser. Semiconductor laser 140 has a layer structure 142 along layer thickness coordinate x1. A first reflective layer 144 which is designed as a distributed Bragg reflector, for example, i.e., in each case having a layer structure with a plurality of differently doped layers, is situated on a substrate S'. A second dielectric reflective layer 146 together with the first dielectric reflective layer forms an optical resonator. An active zone 148, among other things, is integrated between reflective layers 144, 146, and contains, for example, a quantum film for generating laser radiation. A first electrical contact may be provided on or above second reflective layer 146 in FIG. 15 (see reference numeral 144a). A second electrical contact may be situated in the area of substrate S', or at the bottom in FIG. 15. As soon as a potential difference is applied to surface-emitting semiconductor laser 140 via these electrical contacts, a current flow I results (see the arrows), and laser radiation L is generated which is emitted upwardly in FIG. 15 through a light exit aperture in electrical contact 144a. Contacting layer 144a corresponds, for example, to metal plating M of the circuit system according to the present invention according to FIG. 2b.

As described above, a plurality of surface-emitting semiconductor lasers 140 of the type shown in FIG. 15 as an example may be integrated into one or both of semiconductor components 120, 130. In the present case, semiconductor components 120, 130 are also referred to as a VCSEL array.

Figure 4:
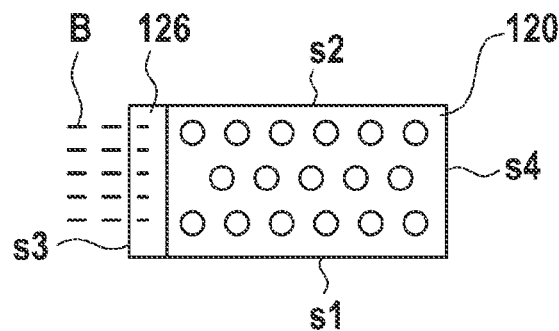
FIG. 4 schematically shows a top view of another specific embodiment of an optoelectronic semiconductor component.

FIG. 4 schematically shows a top view of a semiconductor component 120 according to another specific embodiment. Semiconductor component 120 has an essentially rectangular basic geometry with two long sides s1, s2 and two short sides s3, s4. According to the present invention, an electrical connecting area 126 for contacting with the aid of bonding wires B is situated in the area of a short side s3 of the rectangular configuration, so that the other sides s1, s2, s4 may be used for adjacently situating additional semiconductor components (not shown in FIG. 4) without these areas having to be impaired by bonding wires.

Figure 5:
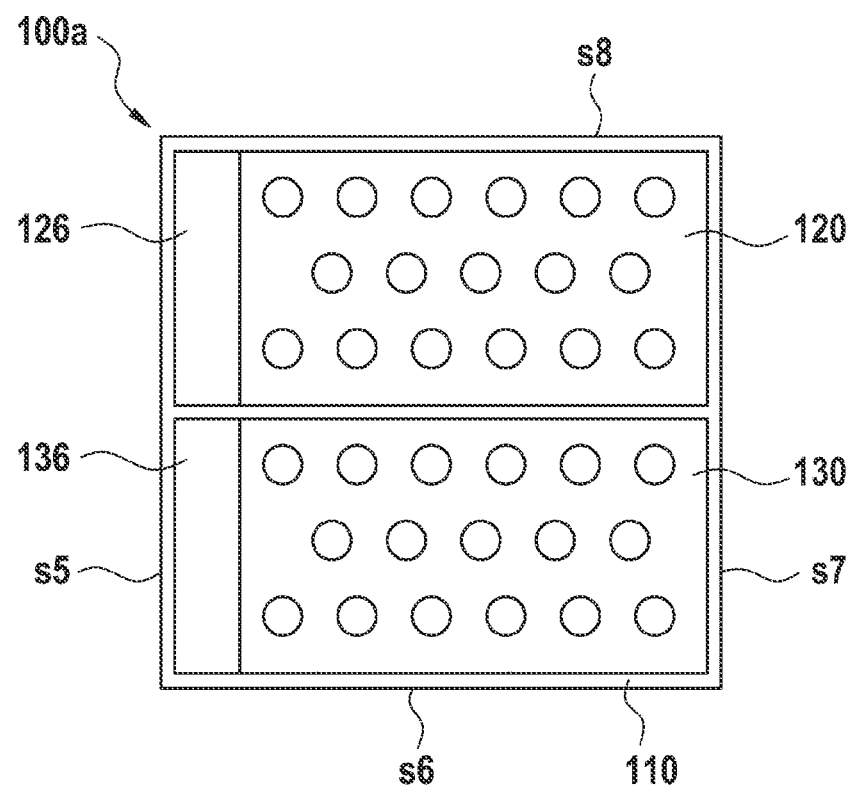
FIG. 5 schematically shows a top view of a circuit system according to another specific embodiment.

For example, a circuit system 100a of the type shown in FIG. 5 may be produced using a semiconductor component 120 according to FIG. 4. Circuit system 100a has an electrically conductive support surface 110 and a first semiconductor component 120, designed according to FIG. 4, for example, and therefore has its electrical connecting area 126 at the left in FIG. 5. A second semiconductor component 130 with a similar design likewise has its electrical connecting area 136 to the left in FIG. 5 and on a short side of semiconductor component 130, so that both connecting areas 126, 136 are associated with the same side s5 of support surface 110. Electrical contacting of semiconductor components 120, 130, and thus of overall circuit system 100a, may thus advantageously take place solely in the area of side s5 of support surface 110, so that the other sides s6, s7, s8 of support surface 110 are once again usable for adjacent mounting of circuit systems according to the present invention having the same or a different design, without having to provide bonding wires or the like in these areas.

The configuration according to FIG. 5 also has the advantage according to the present invention that the different semiconductor components 120, 130 establish electrically conductive contacts with support surface 110 with a respective n-conductive or p-conductive surface, so that an electrical series circuit once again results which extends from first connecting area 126 of first semiconductor component 120, through this first semiconductor component, through support surface 110, out of the plane of the drawing in FIG. 5, and through second semiconductor component 130 up to its connecting area 136.

In the design of semiconductor components 120, 130 as VCSEL arrays, the configuration of the individual semiconductor components is preferably selected in such a way that a differential resistance in a preferred electrical operating point and the number of surface-emitting semiconductor lasers per semiconductor component 120, 130 are approximately equal in order to achieve approximately equal electrical resistances for semiconductor components 120, 130. Otherwise, the semiconductor component with the larger electrical resistance could impair the operation of the semiconductor component to which it is connected in series.

Figure 6:
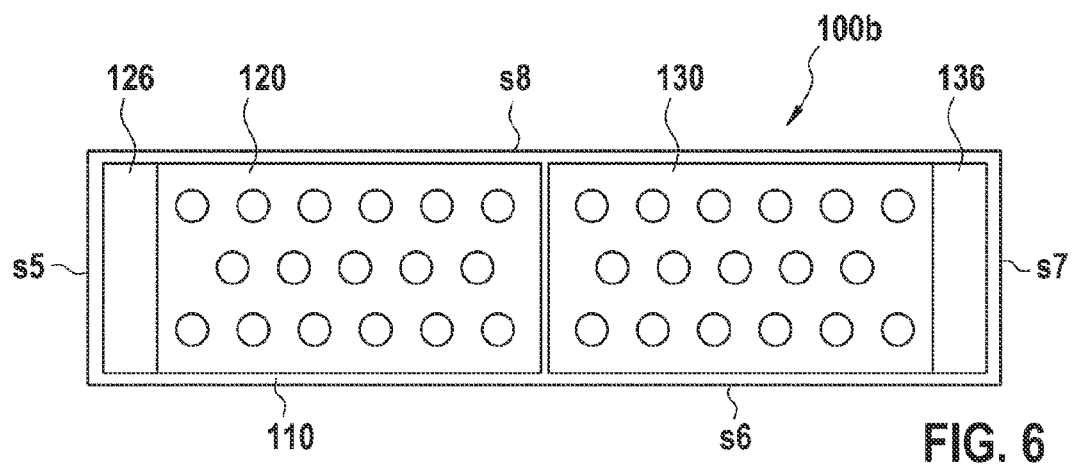
FIG. 6 schematically shows a top view of a circuit system according to yet another specific embodiment.

FIG. 6 shows another specific embodiment of a circuit system 100b according to the present invention which has an essentially rectangular geometry. This geometry is achieved in that two rectangular semiconductor components 120, 130 are situated with their short sides opposite one another in such a way that connecting area 126 of first semiconductor component 120 is situated on a first short side s5 of support surface 110, and electrical connecting area 136 of second semiconductor component 130 is situated on a side s7 of support surface 110 opposite first short side s5.

In contrast to the configuration depicted in FIG. 5, circuit system 100b according to FIG. 6 must therefore be electrically contacted on both short sides s5, s7 of the support surface, but the two long sides s6, s8 of support surface 110 remain for adjacent mounting of additional circuit systems according to the present invention having the same or a different design.

In addition to the use for VCSEL arrays (FIG. 6), the configuration of circuit system 100b according to FIG. 6 is also suitable in a particularly advantageous manner for use of semiconductor components 120', 130' (FIG. 8) containing a plurality of edge-emitting semiconductor lasers.

Figure 8:
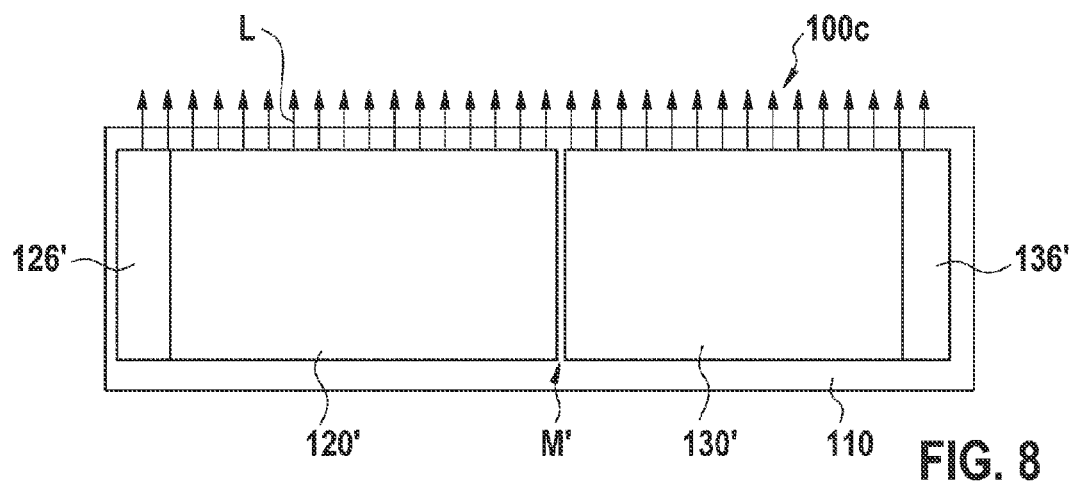
FIG. 8 schematically shows a top view of a circuit system according to one specific embodiment in which edge-emitting semiconductor lasers are provided in the optoelectronic semiconductor components.

FIG. 8 shows a top view of a corresponding configuration. Similar to the configuration according to FIG. 6, semiconductor components 120', 130' have electrical connecting areas 126', 136'. The edge emitters of semiconductor components 120', 130' are situated and configured in such a way that they emit their generated laser radiation L upwardly in the plane of the drawing in FIG. 8, i.e., out of a side area of components 120', 130' which is essentially perpendicular to the plane of the drawing in FIG. 8. In this specific embodiment 100c of the circuit system according to the present invention, once again the intercomponent distance in a middle area M' of support surface 110 or system 100c is very advantageously particularly small, so that a homogeneous "light density" is achievable due to the essentially uniform adjacent spacing of a plurality of edge emitters of the two semiconductor components 120', 130'.

Figure 7:
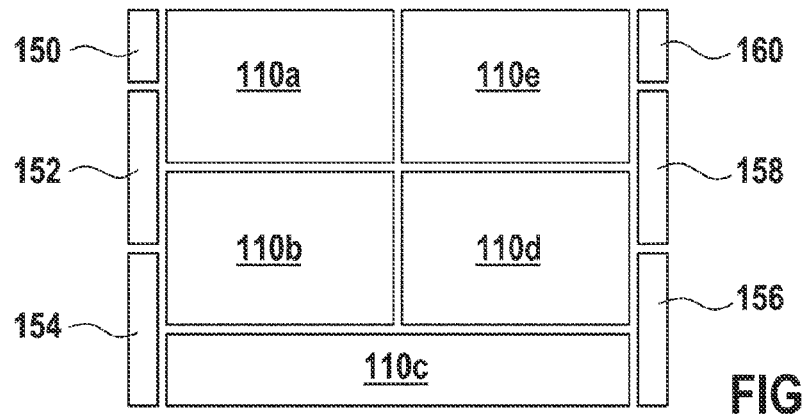
FIG. 7 schematically shows a top view of electrically conductive support surfaces of an optoelectronic semiconductor circuit according to another specific embodiment.

FIG. 7 schematically shows a top view of a plurality of electrical support surfaces 110a, . . . , 110e for forming an optoelectronic semiconductor circuit, having a total of five circuit systems, of the types according to FIG. 5 and FIG. 6 (and/or FIG. 8), configured according to the present invention.

Support surfaces 110a, 110b are equipped, for example, with semiconductor components 120, 130 according to FIG. 5, and thus once again have in each case a series circuit of the two semiconductor components 120, 130 according to FIG. 5. Support surfaces 110d, 110e are similarly equipped with corresponding semiconductor components (not shown in FIG. 7). Support surface 110c is equipped with two semiconductor components 120, 130 in the type of configuration 100b depicted in FIG. 6.

In addition to support surfaces 110, . . . , 110e, further electrically conductive surfaces 150, 152, 154, 156, 158, 160 are provided which, for example, may likewise be applied as a metal plating to a nonconductive substrate (reference character S in FIG. 2b). Accordingly, conductive surfaces 150, . . . , 160 may advantageously be situated in the same plane as support surfaces 110a, . . . , 110e.

Figure 9A:
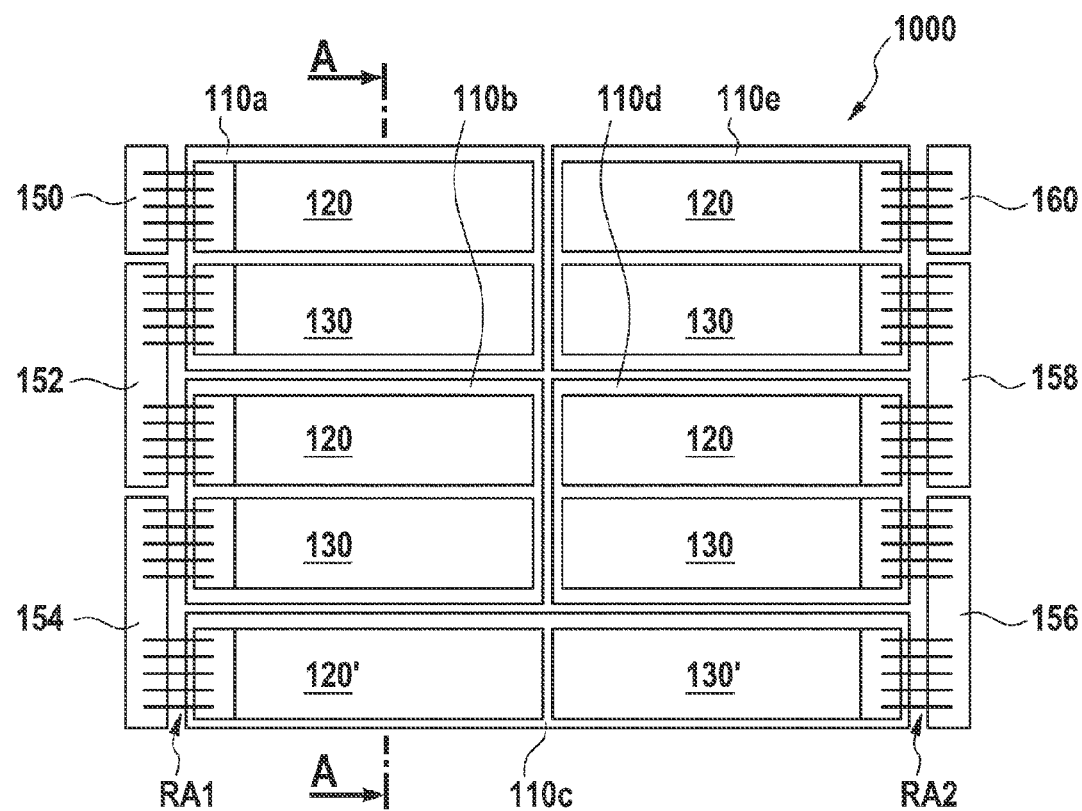
FIG. 9a schematically shows a top view of another specific embodiment of an optoelectronic semiconductor circuit.

FIG. 9a shows a configuration of optoelectronic semiconductor circuit 1000 which, after being equipped with the support surfaces according to FIG. 7, results in above-mentioned semiconductor components 120, 130, 120, 130.

An electrical connection for optoelectronic semiconductor circuit 1000 according to FIG. 9a is achieved, for example, by connecting a first reference potential to first conductive surface 150. This first conductive surface 150 is electrically connected to an electrical connecting area of a first semiconductor component 120, situated on first support surface 110a, with the aid of bonding wires, not shown in greater detail in FIG. 9a. The configuration according to the present invention of semiconductor components 120, 130 situated on first support surface 110a results in the series circuit of components 120, 130 with one another, described numerous times above, which itself requires no bonding wires between components 120, 130. Only the electrical connecting area of second semiconductor component 130 of support surface 110a is contacted, with the aid of bonding wires (not described in greater detail), to a second conductive surface 152 which is connected with the aid of further bonding wires to a connecting area of a first semiconductor component 120 on second support surface 110b, and so forth. Overall, a series circuit results between first reference potential 150 and a second reference potential, which is connected to electrically conductive surface 160, for example, via components 150, 120, 110a, 130, 152, 120, 110b, 130, 154, 120', 110c, 130', 156, 130, 110d, 120, 158, 130, 110e, 120, 160.

Accordingly, optoelectronic semiconductor circuit 1000 according to FIG. 9a includes a series circuit of five circuit systems in total, respectively associated with support surfaces 110a through 110e and contains a series circuit of its two semiconductor components 120, 130 or 120', 130' in question.

The configuration depicted in FIG. 9a has the particular advantage that bonding wires for electrically contacting the circuit systems to one another and to reference potentials 150, 160 are necessary only in radially outer edge areas RA1, RA2, so that an inner area of optoelectronic semiconductor circuit 1000 is completely clear of bonding wires, and the intercomponent distances in question between the individual circuit systems may be selected to be very small. The particular advantage of this configuration is that high brilliance may be achieved compared to those systems which in inner areas between the various circuit systems require bonding wires for electrical contacting.

It is pointed out once again that FIG. 9a represents only a schematic top view, and that semiconductor components 120, 130, 120', 130' may advantageously be selected with respect to their geometry in such a way that in each case they essentially cover approximately one-half of corresponding shared support surface 110a, 110c. In addition, the distances of the particular support surfaces from one another, or of the resulting circuit systems on the electrically nonconductive substrate from one another, may be selected to be small enough that electrical insulation is achieved which is just sufficient for the operating parameters of optoelectronic semiconductor circuit 1000. In other words, in an actual system, components 120, 130, 120', 130' may be positioned significantly closer to one another than schematically shown in FIG. 9a, so that virtually no areas result between the various circuit systems or their semiconductor components which do not contribute to the emission of laser radiation. As a result, the brilliance of optoelectronic semiconductor circuit 1000 according to FIG. 9a may be considerably greater than the brilliance of the conventional systems, in particular increases of approximately 10% to approximately 20% being achievable.

Figure 9B:
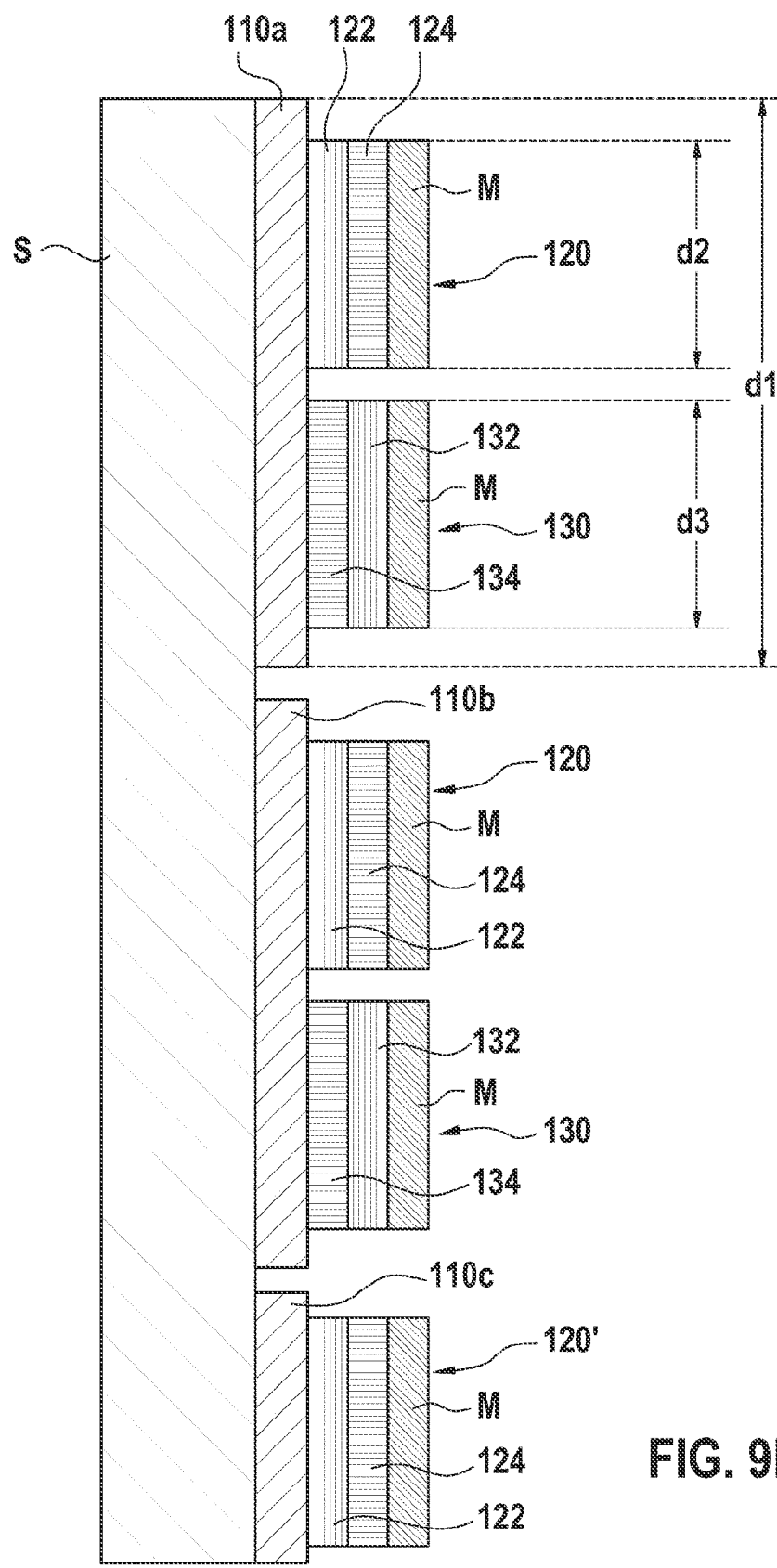

FIG. 9b shows a cross section of optoelectronic semiconductor circuit 1000 according to FIG. 9a along line A-A in FIG. 9a, viewed in the direction of the arrow.

The configuration of support surfaces 110a, 110b, 110c on an electrically nonconductive substrate S is apparent. These support surfaces may be designed, for example, in the form of an electrically conductive metal plating on substrate S.

A layer structure of first semiconductor component 120 of support surface 110a is composed of an n-conductive layer or surface 122 and a p-conductive layer or surface 124, situated to the right in FIG. 9b, adjoined by a metal plating M even farther to the right in FIG. 9b. This layer structure 122, 124, M essentially corresponds to layer structure 144, 146, 144a of the surface emitter according to FIG. 15 shown as an example; active zone 148, which contains quantum films or other gain media, for example, is not depicted in the cross section in FIG. 9b.

When reference is made herein to the term "surface" with regard to the semiconductor components, this refers to the corresponding surfaces of n-conductive layer 122 or of p-conductive layer 124. For example, a surface of n-conductive layer 122 of first semiconductor component 120 facing support surface 110a (FIG. 9d) is used for electrical contacting, and a surface of n-conductive layer 122 facing away from first support surface 110a is connected to p-conductive layer 124 of semiconductor component 120 via an active zone (not depicted), and so forth.

In contrast to the layer structure of first semiconductor component 120 on first support surface 110a, second semiconductor component 130 has an essentially inverse layer structure. A p-conductive layer 134 is situated on electrically conductive support surface 110a, and an n-conductive layer 132 is situated between metal plating M and p-conductive layer 134. This results in an electrical series circuit between metal plating M of first semiconductor component 120 on first support surface 110a, layer 124, layer 122, shared first support surface 110a, layer 134, layer 132, and metal plating M of second semiconductor component 130.

Semiconductor components 120, 130 on second support surface 110d have a similar design. A series circuit of the circuit system of support surfaces 110a, 110b relative to one another is achieved according to FIG. 9a by electrically conductive surface 152 and its associated bonding wires, which are connected on the one hand to the connecting surface of second semiconductor component 130 of first support surface 110a, and on the other hand, to a connecting surface, not described in greater detail, of first semiconductor component 120 of second support surface 110b.

Overall, an electrical series circuit of five circuit systems according to the present invention is thus achieved between connections 150, 160 due to the configuration according to FIGS. 9a, 9b. Geometric extension d2, d3 of semiconductor components 120, 130, respectively, according to FIG. 9b is preferably selected to be large enough that it covers virtually entire support surface 110a, and therefore the sum of d2 and d3 is virtually d1, resulting in an advantageous surface area utilization and a particularly large surface which emits laser radiation. The distances of support surfaces 110a, 110b from one another are to be selected in such a way that for the electrical operating parameters of the optoelectronic semiconductor circuit, they achieve a sufficient insulating effect between the surfaces.

Figure 10A:
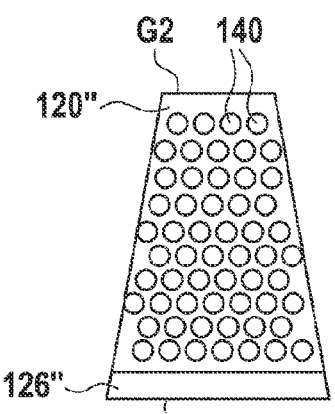
FIG. 10a schematically shows a top view of a trapezoidal semiconductor component according to another specific embodiment.

FIG. 10a schematically shows a top view of another specific embodiment of the present invention which provides an essentially trapezoidal design of a first semiconductor component 120". Semiconductor component 120" may once again be designed as a VCSEL array. An electrical connecting area 126" for electrically contacting semiconductor component 120" with the aid of bonding wires (not shown) is particularly advantageously situated along longer base side G1 of the trapezoidal configuration. Alternatively or additionally, the electrical contact may also be situated along shorter base side G2, or along at least one of the two other sides of the trapezoidal configuration.

Figure 10B:
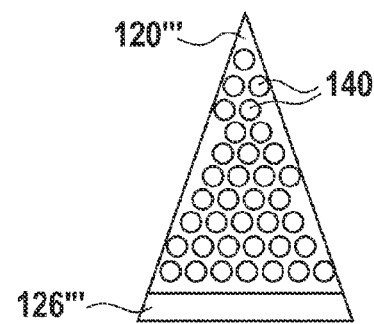
FIG. 10b schematically shows a top view of a triangular semiconductor component according to another specific embodiment.

FIG. 10b schematically shows a top view of another specific embodiment of the present invention, in which a semiconductor component 120''' has an essentially triangular geometry. As is apparent from FIG. 10b, a connecting area 126''' for electrical contacting, for example with the aid of bonding wires (not shown), may preferably once again be situated in the area of a base side of the triangular configuration.

Figure 11:
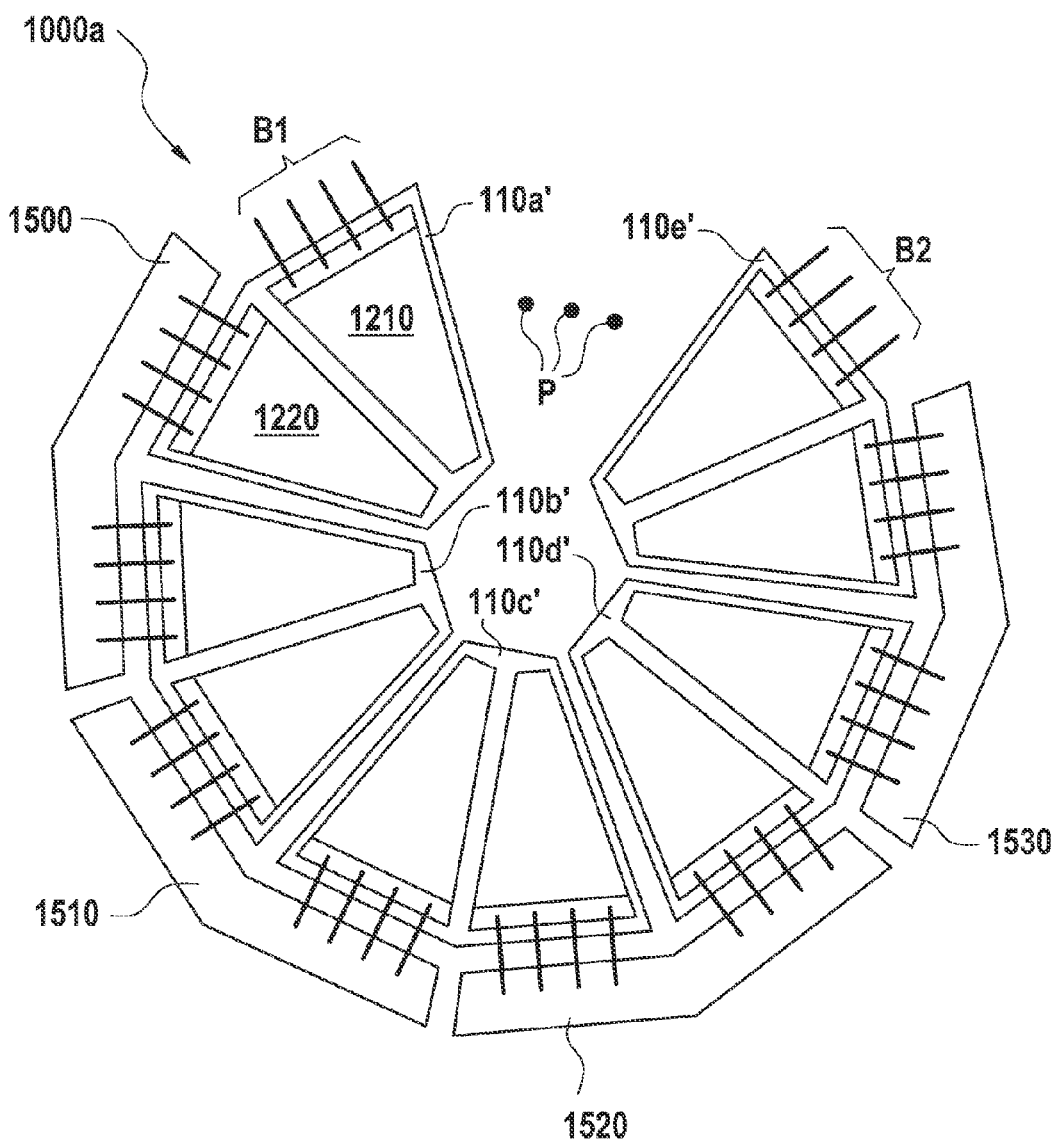
FIG. 11 schematically shows a top view of another optoelectronic semiconductor circuit according to the present invention having an essentially polygonal or circular overall geometry.

FIG. 11 schematically shows a top view of an optoelectronic semiconductor circuit 1000a according to another specific embodiment.

In contrast to the optoelectronic semiconductor circuit according to FIG. 9a, which has an essentially rectangular basic geometry, configuration 1000a according to FIG. 11 has an essentially polygonal or approximately circular basic geometry.

Individual electrical support surfaces 110a', 110b', 110c', 110d', 110e' are electrically connected to one another in series according to the principle previously described with reference to FIGS. 9a, 9b, in particular with the aid of conductive surfaces 1500, 1510, 1520, 1530 and their associated bonding wires.

Accordingly, this results overall in a series circuit between bonding wires B1 and bonding wires B2 of the configuration according to FIG. 11, which includes a total of five circuit systems according to the present invention. Each circuit system has an essentially trapezoidal basic geometry, and has two semiconductor components 1210, 1220 with an essentially trapezoidal design, whose geometry is selected, for example, similarly as for the specific embodiment according to FIG. 10a.

The configuration of the circuit systems, depicted in FIG. 11, with their short base sides facing one another results in an essentially polygonal or circular geometry of overall system 1000a, which via the individual geometric parameters of trapezoidal basic shapes may be adapted with regard to the total number of elements (see points P).

Figure 12:
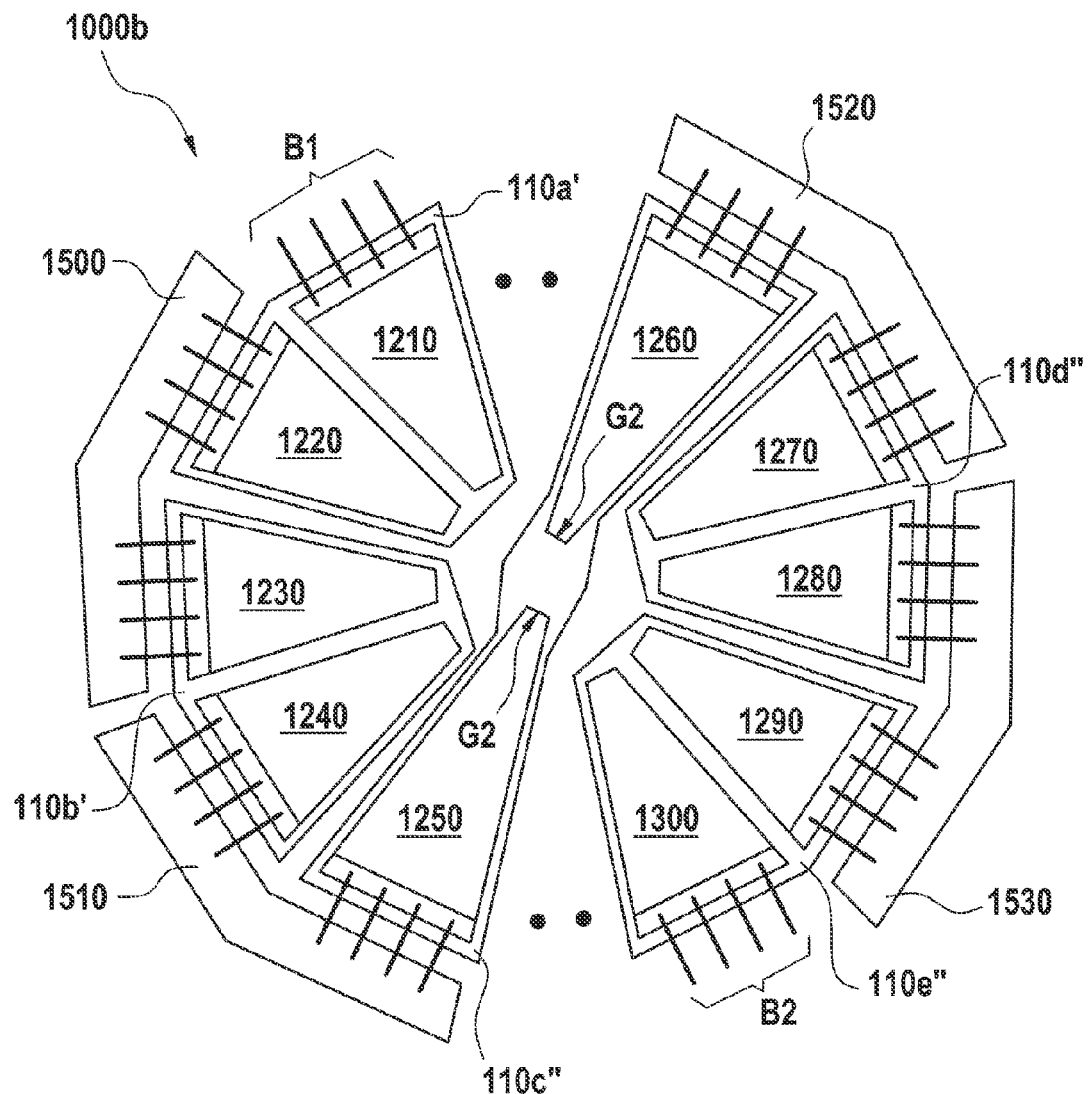
FIG. 12 schematically shows a top view of yet another specific embodiment of an optoelectronic semiconductor circuit having an essentially polygonal or circular overall geometry.

FIG. 12 shows a specific embodiment 1000b comparable to that in FIG. 11, in which, however, four circuit systems having an essentially trapezoidal basic shape with their corresponding support surfaces 110a', 110b', . . . are provided in which a fifth circuit system according to the present invention, however, has an essentially dumbbell-shaped geometry with a similarly shaped support surface 110c". In the present case, this essentially dumbbell-shaped geometry is achieved in that the circuit system in question, which includes semiconductor components 1250, 1260, is designed in such a way that shorter base sides G2 of each trapezoidal semiconductor component 1250, 1260 are situated opposite one another. Also in configuration 1000b depicted in FIG. 12, a series circuit of the respective two semiconductor components 1210, 1220; 1230, 1240; 1250, 1260; 1270, 1280; 1290, 1300 contained thereon is achieved in each case on individual support surfaces 110a', 110b', 110c" . . . , which also results in an electrical series circuit between bonding wires B1, B2 via components 1210, 110a', 1220, 1500, 1230, 110b', 1240, 1510, 1250, 110c," 1260, 1520, 1270, 110d," 1280, 1530, 1290, 110e," 1300, B2.

Providing a dumbbell-shaped circuit system which includes semiconductor components 1250, 1260 results in the advantage that the radially inner area of optoelectronic semiconductor circuit 1000b may likewise be filled with surface emitters of semiconductor components 1250, 1260, which are situated in the area of their short base sides G2, resulting in an essentially homogeneous light density across entire optoelectronic semiconductor circuit 1000b, and thus, increased brilliance compared to conventional devices.

The electrical contacts for implementing the series circuit of different circuit systems according to the present invention with one another are once again particularly advantageously situated solely radially on the outside of overall configuration 1000a, 1000b, so that the conductive surfaces or bonding wires also do not have to be situated in those radially inner areas which preferably should be available for the emission of laser radiation.

Figure 13:
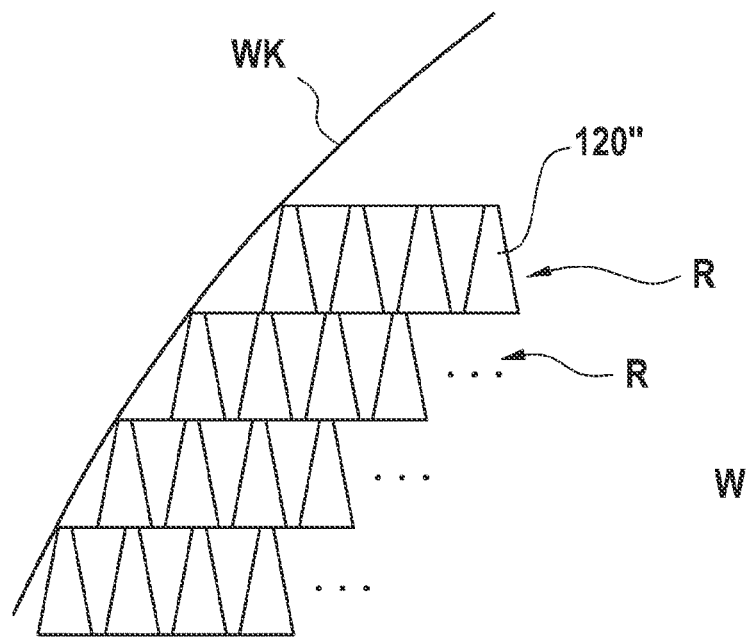
FIG. 13 schematically shows multiple trapezoidal semiconductor components relative to a contour of a wafer.

FIG. 13 schematically shows a portion of contour WK of a wafer W which, for example, may contain a plurality of surface-emitting semiconductor lasers (not shown) and which may thus be used as the basis for manufacturing above-described semiconductor components 120, 130, 120', 130'.

To allow cost-effective manufacture, in the case of semiconductor components 120" having a trapezoidal design, these may be situated, as depicted in FIG. 13, with their slanted sides adjoining one another in such a way that the respective short or long base side of a first trapezoidal element 120" is flush with the respective long or short base side of an adjacent trapezoidal element, resulting in a strip-shaped configuration R which allows particularly good utilization of entire wafer surface W.

Figure 14:
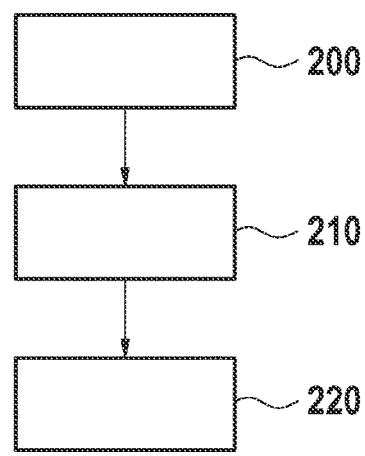
FIG. 14 shows a simplified flow chart of one specific embodiment of the method according to the present invention.

FIG. 14 shows a simplified flow chart of one specific embodiment of the present invention.

An electrically conductive support surface 110 (FIG. 2a) is provided in a first step 200, for example by metal plating of an appropriate area of an electrically nonconductive substrate S (FIG. 2b).

In a subsequent step 210 (FIG. 14), a first optoelectronic semiconductor component 120 is situated with an n-conductive surface 122 facing electrically conductive support surface 110 and is connected to the support surface in an electrically conductive manner.

In a subsequent step 220, second optoelectronic semiconductor component 130 is situated with a p-conductive surface facing support surface 110 and is connected to the support surface in an electrically conductive manner, thus advantageously resulting in the series circuit according to the present invention between the two semiconductor components 120, 130, using support surface 110 as an electrical contacting means between semiconductor components 120, 130.

It is understood that the above-mentioned sequence of steps 210, 220, i.e., the formation of the first and second semiconductor components, is reversible, so that initially a p-conductive surface of a first of the two semiconductor components may be applied to the support surface, and so forth.

Based on the principle according to the present invention, providing bonding wires for electrically contacting the two components 120, 130 to one another may advantageously be dispensed with.

Overall, use of the principle according to the present invention allows the design of optoelectronic semiconductor circuits having particularly high brilliance, since the size of surfaces which do not emit radiation is minimized. In addition, by using the principle according to the present invention, the installation size of the radiation-emitting system may be reduced, which is particularly useful under difficult installation conditions.

Furthermore, a reduction in the component costs is to be expected by using the principle according to the present invention, since bonding wires may be dispensed with. In addition, the handling of individual parts as well as the complexity of optoelectronic semiconductor circuits may be reduced.

In addition to the above-described series connection, the principle according to the present invention may also be advantageously used for a parallel connection.

In addition to providing vertically emitting semiconductor lasers, for example edge emitters, light-emitting diodes, photodiodes, and the like may also be provided in semiconductor components 120, 130, 120', 130' provided according to the present invention and described above.

Figure 16:
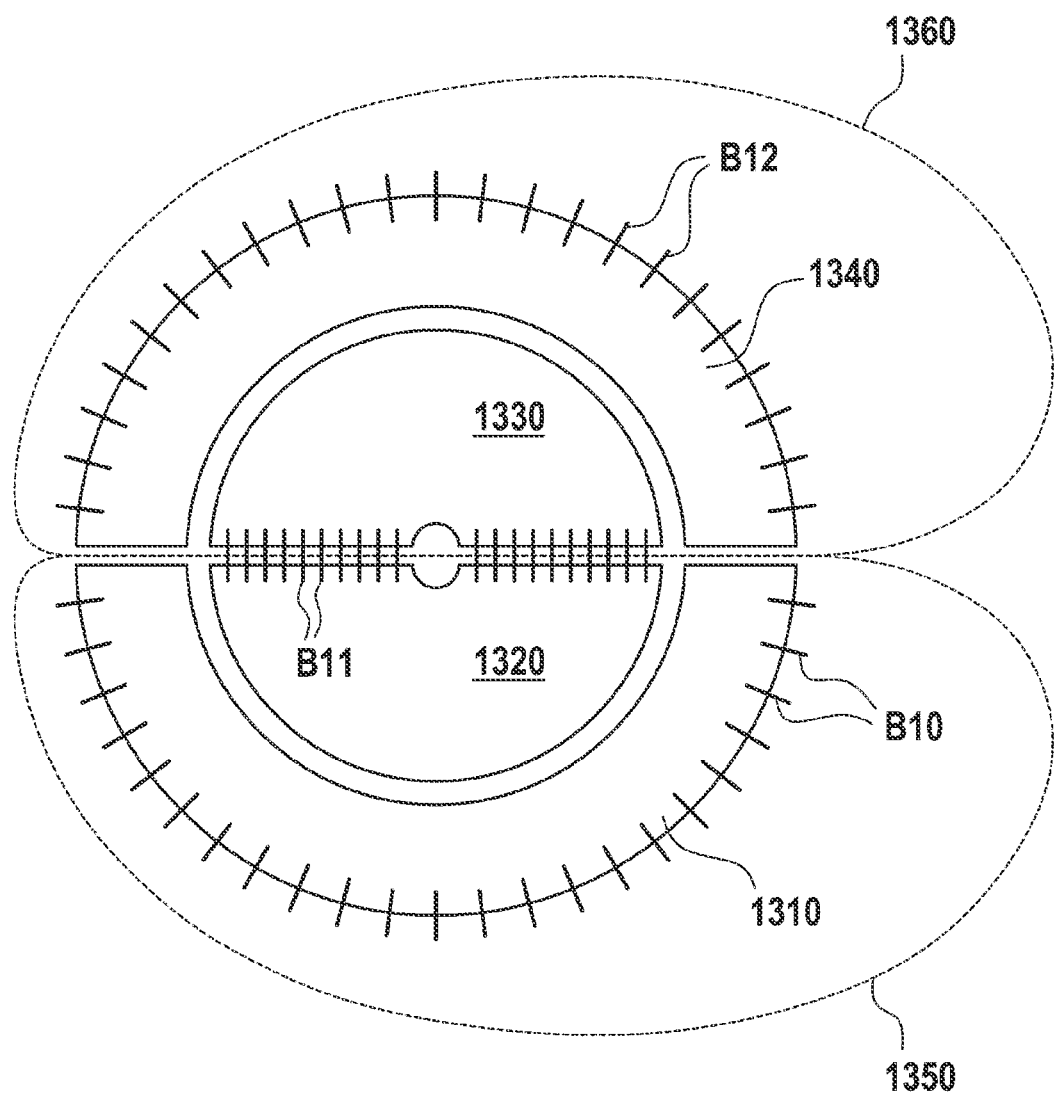
FIG. 16 schematically shows a top view of another specific embodiment.

FIG. 16 shows another specific embodiment of the present invention in which a first semiconductor component 1310 having an approximately semi-circular ring design, together with a second semiconductor component 1320 having an approximately semicircular design, are situated on a shared support surface 1350. According to the principle according to the present invention, a so-called "n-up" mounting is selected for semiconductor component 1310, while a so-called "p-up" mounting is selected for semiconductor component 1320. Further semiconductor components 1330, 1340 are situated on a second support surface 1360 according to the principle according to the present invention.

An electrical series circuit results as follows: bonding wires B10, semiconductor component 1310, support surface 1350, semiconductor component 1320, bonding wires B11, semiconductor component 1330, support surface 1360, semiconductor component 1340, bonding wires B12.

What is claimed is:

1. A circuit system, comprising:
   a first optoelectronic semiconductor component comprising (a) a first n-conductive layer, (b) a first p-conductive layer above the first n-conductive layer, and (c) a first top surface, including a first area;
   a second optoelectronic semiconductor component comprising (a) a second p-conductive layer, (b) a second n-conductive layer above the second p-conductive layer, and (b) a second top surface, including a second area;
   a single electrically conductive support surface shared by the first and second optoelectronic semiconductor components for support of the first and second optoelectronic semiconductor components by and above the support surface, wherein:
      surfaces of the first n-conductive layer and the second p-conductive layer face toward the conductive support surface;
      the first and second areas of the first and second top surfaces, respectively, face away from the support surface;
      the first and the second optoelectronic semiconductor components are connected to the support surface in an electrically conductive manner; and
      a connecting area is configured on at least one of: (i) the first top surface within an area that is less than the first area and is over the first n-conductive and p-conductive layers and (ii) the second top surface within an area that is less than the second area and is over the second n-conductive and p-conductive layers; and
   at least one bonding wire contacting the connecting area for electrically coupling the circuit system to an external system.

2. The circuit system as recited in claim 1, wherein the first and second optoelectronic semiconductor components each include multiple semiconductor lasers, wherein the semiconductor lasers include at least one of (i) surface-emitting semiconductor lasers and (ii) edge-emitting semiconductor lasers.

3. The circuit system as recited in claim 1, wherein at least one of the first and second optoelectronic semiconductor components has an essentially rectangular basic shape having two long sides and two short sides, and the connecting area extends essentially along at least one of the two short sides.

4. The circuit system as recited in claim 3, wherein both of the first top surface and the second top surface include the connecting area, and wherein the first and second optoelectronic semiconductor components are arranged on the support surface in such a way that the respective connecting areas of the first and second opto-electronic semiconductor components are each associated with the same side of the support surface.

5. The circuit system as recited in claim 3, wherein both of the first top surface and the second top surface include the connecting area, and wherein the first and second optoelectronic semiconductor components are arranged on the support surface in such a way that the respective connecting areas of the first and second optoelectronic semiconductor components are each associated with respective opposite sides of the support surface.

6. The circuit system as recited in claim 1, wherein each of the first top surface and second top surface of the optoelectronic semiconductor components has one of an essentially trapezoidal basic shape or an essentially triangular basic shape.

7. The circuit system as recited in claim 6, wherein in the case of the trapezoidal basic shape, a longer base side of each of the first top surface and second top surface of the optoelectronic semiconductor components has the connecting area.

8. The circuit system as recited in claim 6, wherein in the case of the trapezoidal basic shape, the first and second optoelectronic semiconductor components are arranged with respect to one another in such a way that shorter base sides of the first top surface and second top surface of the first and second optoelectronic semiconductor components are situated opposite one another.

9. The circuit system as recited in claim 1, further comprising surface-emitting lasers arranged on the first area and on the second area in a region that is external to the connecting area.

10. An optoelectronic semiconductor circuit comprising:
    at least two circuit systems, each including:
       a first optoelectronic semiconductor component comprising (a) a first n-conductive layer, (b) a first p-conductive layer above the first n-conductive layer, and (c) a first top surface, including a first area;
       a second optoelectronic semiconductor component comprising (a) a second p-conductive layer, (b) a second n-conductive layer above the second p-conductive layer, and (b) a second top surface, including a second area;
       a single electrically conductive support surface shared by the first and second optoelectronic semiconductor components for support of the first and second optoelectronic semiconductor components by and above the support surface, wherein:
          surfaces of the first n-conductive layer and the second p-conductive layer face toward the conductive support surface;
          the first and second areas of the first and second top surfaces, respectively, face away from the support surface;
          the first and the second optoelectronic semiconductor components are connected to the support surface in an electrically conductive manner; and
          a connecting area is configured on at least one of: (i) the first top surface within an area that is less than the first area and is over the first n-conductive and p-conductive layers and (ii) the second top surface within an area that is less than the second area and is over the second n-conductive and p-conductive layers; and
       the at least two circuit systems are electrically connected to one another in series with the aid of at least one of (i) electrically conductive surfaces which are situated in the same plane as the support surfaces, and (ii) bonding wires; and at least one bonding wire contacting the connecting area for electrically coupling the circuit system to an external system.

11. The semiconductor circuit as recited in claim 10, wherein the circuit systems are formed and situated relative to one another in such a way that a contour of the semiconductor circuit has one of (i) the shape of a regular n-polygon, where n>4, and (ii) an approximately circular shape.

12. The semiconductor circuit as recited in claim 10, wherein the circuit systems are formed and situated relative to one another in such a way that at least one of (i) the conductive surfaces and (ii) the bonding wires are situated only in an outer edge area of the semiconductor circuit.

13. A method for manufacturing at least one circuit system, the method comprising:
    providing a first optoelectronic semiconductor component comprising (a) a first n-conductive layer, (b) a first p-conductive layer above the first n-conductive layer, and (c) a first top surface, including a first area;
    providing a second optoelectronic semiconductor component comprising (a) a second p-conductive layer, (b) a second n-conductive layer above the second p-conductive layer, and (b) a second top surface, including a second area;
    providing a single electrically conductive support surface shared by the first and second optoelectronic semiconductor components for support of the first and second optoelectronic semiconductor components by and above the support surface;
    connecting the first and the second optoelectronic semiconductor components to the support surface in an electrically conductive manner, such that (a) surfaces of the first n-conductive layer and the second p-conductive layer face toward the conductive support surface and (b) the first and second areas of the first and second top surfaces, respectively, face away from the support surface;
    providing a connecting area on at least one of: (i) the first top surface within an area that is less than the first area and is over the first n-conductive and p-conductive layers and (ii) the second top surface within an area that is less than the second area and is over the second n-conductive and p-conductive layers; and
    attaching at least one bonding wire to the connecting area for electrically coupling the circuit system to an external system.

14. The method as recited in claim 13, wherein at least two circuit systems are produced and electrically connected to one another in series with the aid of at least one of (i) electrically conductive surfaces which are situated in the same plane as the support surfaces, and (ii) bonding wires.

15. The method as recited in claim 13, wherein a first system having a plurality of surface-emitting semiconductor lasers is used as the first optoelectronic semiconductor component, the first system having decoupling surfaces, situated on a surface opposite from its n-conductive surface, for decoupling the laser radiation generated by the surface-emitting semiconductor lasers, and a second system having a plurality of surface-emitting semiconductor lasers is used as the second optoelectronic semiconductor component, the second system having decoupling surfaces, situated on a surface opposite from its p-conductive surface, for decoupling the laser radiation generated by the surface-emitting semiconductor lasers.

16. The method as recited in claim 15, further comprising:
    arranging, on the support surface, the first optoelectronic semiconductor component at a distance from the second optoelectronic semiconductor component, wherein the distance is selected to be (i) just large enough to maintain a reliable electrical separation between the two components, or (ii) a size that maintains a homogeneous light density between the plurality of surface-emitting semiconductor lasers on the first system and the plurality of surface-emitting semiconductor lasers on the second system.

17. An optoelectronic semiconductor circuit comprising:
    at least two circuit systems, each including:
        an electrically conductive support surface;
        a first optoelectronic semiconductor component comprising (a) an n-conductive surface facing toward the support surface and (b) a first stop surface, including a first area, facing away from the support surface; and
        a second optoelectronic semiconductor component comprising (a) a p-conductive surface facing toward the support surface and (b) a second top surface, including a second area, facing away from the support surface, wherein:
            the first and the second optoelectronic semiconductor components are connected to the support surface in an electrically conductive manner;
            a connecting area for electrically coupling to an external system is configured on at least one of: (i) the first top surface within an area less than the first area and (ii) the second top surface within an area less than the second area;
            the at least two circuit systems are electrically connected to one another in series with the aid of at least one of (i) electrically conductive surfaces which are situated in the same plane as the support surfaces, and (ii) bonding wires; and
            the electrically conductive support surface for one of the at least two circuit systems is arranged in a different shape than another one of the at least two circuit systems.

* * * * *